United States Patent
Xu et al.

(10) Patent No.: US 11,984,510 B2
(45) Date of Patent: May 14, 2024

(54) COMPOSITE METAL OXIDE SEMICONDUCTOR AND THIN-FILM TRANSISTOR MADE THEREFROM AND ITS APPLICATION

(71) Applicant: South China University of Technology, Guangzhou (CN)

(72) Inventors: Miao Xu, Guangzhou (CN); Hua Xu, Guangzhou (CN); Weijing Wu, Guangzhou (CN); Weifeng Chen, Guangzhou (CN); Lei Wang, Guangzhou (CN); Junbiao Peng, Guangzhou (CN)

(73) Assignee: South China University of Technology, Guangzhou (CN)

( * ) Notice: Subject to any disclaimer, the term of this patent is extended or adjusted under 35 U.S.C. 154(b) by 0 days.

(21) Appl. No.: 16/678,173

(22) Filed: Nov. 8, 2019

(65) Prior Publication Data

US 2021/0083125 A1    Mar. 18, 2021

(30) Foreign Application Priority Data

Sep. 18, 2019   (CN) .......................... 201910881763.4

(51) Int. Cl.
*H01L 29/786*   (2006.01)
*H01L 29/24*    (2006.01)
*H01L 29/66*    (2006.01)

(52) U.S. Cl.
CPC ...... *H01L 29/78693* (2013.01); *H01L 29/247* (2013.01); *H01L 29/6675* (2013.01)

(58) Field of Classification Search
CPC ............... H01L 27/1225; H01L 29/247; H01L 29/6675; H01L 29/78693
See application file for complete search history.

(56) References Cited

U.S. PATENT DOCUMENTS 7,255,906 B2 *  8/2007  Doi ..................... H01L 45/1293
                                                     430/270.13
7,306,861 B2 * 12/2007  Inoue ..................... C04B 35/50
                                                     252/519.51
(Continued)

FOREIGN PATENT DOCUMENTS

CN    WO 2018/188332 A1 * 10/2018 ............. H01L 29/78

OTHER PUBLICATIONS

Xu et al., "Trap-Assisted Enhanced Bias Illumination Stability of Oxide Thin Film Transistor by Praseodymium Doping." Applied Materials & Interfaces 11 (2019) pp. 5232-5239.*

(Continued)

*Primary Examiner* — Jay C Kim
(74) *Attorney, Agent, or Firm* — Bayramoglu Law Offices LLC (57) ABSTRACT

The present application discloses a composite metal oxide semiconductor which is a metal oxide semiconductor doped with a rare earth oxide. Even doping the praseodymium oxide or ytterbium oxide at a small doping amount, oxygen vacancies could be suppressed as well as the mobility be maintained; critically, the thin-films made thereof can avoid the influence of light on I-V characteristics and stability, which results in great improvement of the stability under illumination of metal oxide semiconductor devices. The present application also disclose the thin-film transistors made thereof the composite metal oxide semiconductor and its application.

7 Claims, 3 Drawing Sheets

(56) References Cited

U.S. PATENT DOCUMENTS

| | | | |
|---|---|---|---|
| 7,862,748 B2* | 1/2011 | Koo | C04B 35/457 |
| | | | 252/521.1 |
| 8,038,911 B2* | 10/2011 | Inoue | C04B 35/50 |
| | | | 204/192.15 |
| 8,093,800 B2* | 1/2012 | Inoue | H01L 51/5215 |
| | | | 313/504 |
| 8,232,552 B2* | 7/2012 | Yano | C23C 14/086 |
| | | | 438/34 |
| 8,333,913 B2* | 12/2012 | Inoue | H01L 29/7869 |
| | | | 204/192.15 |
| 8,354,038 B2* | 1/2013 | Wang | C01G 33/006 |
| | | | 252/629 PZ |
| 8,535,633 B2* | 9/2013 | Schumacher | C23C 8/10 |
| | | | 423/275 |
| 8,546,181 B2* | 10/2013 | Yamazaki | H01L 29/6675 |
| | | | 438/104 |
| 8,581,625 B2* | 11/2013 | Yoneda | H03K 19/0008 |
| | | | 326/38 |
| 8,630,127 B2* | 1/2014 | Uochi | G11C 13/003 |
| | | | 365/189.011 |
| 8,669,556 B2* | 3/2014 | Yamazaki | H01L 29/1033 |
| | | | 257/57 |
| 8,748,879 B2* | 6/2014 | Yano | H01L 29/7869 |
| | | | 438/149 |
| 8,866,141 B2* | 10/2014 | Cho | H01L 29/41733 |
| | | | 257/57 |
| 8,872,179 B2* | 10/2014 | Tsubuku | H01L 29/42384 |
| | | | 257/57 |
| 9,012,913 B2* | 4/2015 | Noda | H01L 27/1255 |
| | | | 257/57 |
| 9,048,265 B2* | 6/2015 | Hondo | H01L 29/7869 |
| 9,064,966 B2* | 6/2015 | Yamazaki | H01L 29/247 |
| 9,099,560 B2* | 8/2015 | Yamazaki | H01L 29/4908 |
| 9,236,495 B2* | 1/2016 | Seo | H01L 29/66969 |
| 9,245,957 B2* | 1/2016 | Kim | H01L 29/78693 |
| 9,257,569 B2* | 2/2016 | Yamazaki | H01L 27/1225 |
| 9,406,808 B2* | 8/2016 | Yamazaki | H01L 27/1225 |
| 9,667,148 B2* | 5/2017 | Kimura | H01L 27/1225 |
| 9,741,864 B2* | 8/2017 | Nabatame | H01L 21/02565 |
| 10,000,842 B2* | 6/2018 | Nakayama | H01L 21/02631 |
| 10,134,852 B2* | 11/2018 | Sasaki | H01L 29/247 |
| 10,546,959 B2* | 1/2020 | Woo | H01L 29/045 |
| 10,672,913 B2* | 6/2020 | Yamazaki | H01L 29/45 |
| 10,756,190 B2* | 8/2020 | Hiroi | C04B 35/62675 |
| 10,872,982 B2* | 12/2020 | Ohno | H01L 29/66969 |
| 10,886,033 B2* | 1/2021 | Jalan | C23C 14/022 |
| 10,896,951 B2* | 1/2021 | Song | H01L 29/78693 |
| 11,677,031 B2* | 6/2023 | Xu | H01L 29/78693 |
| | | | 257/43 |
| 2007/0037402 A1* | 2/2007 | Inoue | C23F 1/20 |
| | | | 438/758 |
| 2013/0133183 A1* | 5/2013 | Lien | C04B 35/62805 |
| | | | 29/612 |
| 2013/0187161 A1* | 7/2013 | Yamazaki | H01L 29/66969 |
| | | | 257/57 |
| 2020/0027993 A1* | 1/2020 | Xu | H01L 21/02266 |
| 2020/0235247 A1* | 7/2020 | Oyama | H01L 21/02592 |

OTHER PUBLICATIONS

Li et al., "Improving Thermal Stability of Solution-Processed Indium Zinc Oxide Thin-Film Transistors by Praseodymium Oxide Doping," Applied Materials & Interfaces 10 (2018) pp. 28764-28771.*

Xu et al., "Trap-Assisted Enhanced Bias Illumination Stability of Oxide Thin Film Transistor by Praseodymium Doping," ACS Applied Materials & Interfaces 11 (2019) pp. 5232-5239.*

Lu et al., "Effects of praseodymium doping on the electrical properties and aging effect of InZnO thin-film transistor," Journal of Materials Science 54 (2019) pp. 14778-14786.*

He et al., "Investigation of 4f-Related Electronic Transitions of Rare-Earth Doped ZnO Luminescent Materials: Insights from First-Principles Calculations," ChemPhysChem 21 (2020) pp. 51-58.*

Ren et al., "Effects of rare-earth erbium doping on the electrical performance of tin-oxide thin film transistors," Journal of Alloys and Compounds 791 (2019) pp. 11-18.*

Li et al., "Improving Thermal Stability of Solution-Processed Indium Zinc Oxide Thin-Film Transistors by Praseodymium Oxide Doping," ACS Applied Materials & Interfaces 10 (2018) pp. 28764-28771.*

Kumar et al., "Analysis of Pr co doped Al:ZnO thin films using feasible nebulizer spray technique for optoelectronic technology," Applied Physics A (2019) 125:712.*

* cited by examiner

COMPOSITE METAL OXIDE SEMICONDUCTOR AND THIN-FILM TRANSISTOR MADE THEREFROM AND ITS APPLICATION

CROSS-REFERENCE TO RELATED APPLICATIONS

This patent application claims priority from Patent Application No. 201910881763.4, filed in The People's Republic of China on Sep. 18, 2019, the contents of which are hereby incorporated by reference in its entirety.

TECHNICAL FIELD

The present application relates generally to a semiconductor fabrication specialized field, specifically relates to materials and device structures used to make the oxide semiconductor thin-film transistor applied in flat panel display devices and detectors, more specifically relates to composite metal oxide semiconductor and thin-film transistor made therefrom and its application.

BACKGROUND

In the metal oxide semiconductor, the 5 s orbit of $In^{3+}$ ions is the major electron transport orbit. Since the bond dissociation energy of the $In^{3+}$ ions and $O^{2+}$ ions is weak, abundant oxygen vacancies are existed in pure $In_2O_3$ thin-film, which is the main cause of the stability degradation of oxide semiconductor thin-film transistor. In general, it requires doping $Ga^{3+}$ ions at a quantity comparable to $In^{3+}$ ions to suppress the oxygen vacancies.

In the meantime, it requires oxide semiconductor thin-films to keep an amorphous structure to ensure the good uniformity of the semiconductor device. Since there are great differences between the crystal structure of ZnO and the $In_2O_3$ or $Ga_2O_3$, it could constrain crystallization to keep the amorphous structure of the material by doping $Zn^{2+}$ ions at a quantity comparable to $In^{3+}$ ions in the thin-film. So far, the most widely applied oxide semiconductor thin-film material is IGZO, by which the molar ration of $In^{2+}$:$Ga^{3+}$:$Zn^{2+}$ is 1:1:1. While, as the large amount doping of the $Ga^{3+}$ and $Zn^{2+}$, the concentration of $In^{3+}$ is greatly diluted, thereby the overlap of the 5 s orbit is reduced as well as the electron mobility is decreased.

Besides, materials such as IGZO have a large number of trap states near the valence band maximum, which results in photo-induced carriers even when the illumination energy is below the forbidden band-width, and at the same time, photo-induced holes are generated near the valence band maximum. These photo-induced holes are easily injected into the gate insulator layer under the action of the gate electric field, which causes a critical problem that the oxide semiconductor thin-film transistors exhibit poor light stability.

SUMMARY

In order to overcome the deficiencies of the prior art, the first object of this present application is to provide a composite metal oxide semiconductor with high mobility and excellent light stability. In the composite metal oxide semiconductor, a small amount of rare-earth oxide such as praseodymium oxide or ytterbium oxide is doped to suppress the oxygen vacancies effectively. At the same time, there are recombination centers for photo-induced carriers generated to enhance the light stability of the semiconductor.

The second object of this present application is to provide a thin-film transistor made thereof.

The third object of this present application is to provide an application of the thin-film transistor.

To achieve the first objects, the present application provides the technical solutions as follows:

Composite metal oxide semiconductor, characterized in that the composite oxide semiconductor is a rare-earth oxide doped metal oxide; in which the metal oxide indium zinc oxide, indium gallium oxide, or indium gallium zinc oxide; the rare-earth oxide is praseodymium oxide and/or ytterbium oxide; The doping molar ratio of praseodymium and/or ytterbium to the metal oxide is in a range from 0.002:1 to 0.4:1; there are recombination centers for photo-induced carriers generated in the composite metal oxide semiconductor.

That is, the composite metal oxide semiconductor provided by the present application is a rare-earth oxide doped composite semiconductor based on indium oxide-based metal oxide. Even at a small doping amount, the praseodymium oxide or ytterbium oxide could suppress oxygen vacancies and can ensure the semiconductor with higher mobility. At the same time, the stability of the semiconductor under illumination conditions was improved.

Preferably, the metal oxide is indium zinc oxide or indium gallium oxide. The molar ratio of indium and zinc or gallium is in a range from 5:1 to 5:4. For example, for indium gallium oxide with a molar ratio of $In_2O_3$:$Ga_2O_3$ is 5:4, its mobility value is 14.8 $cm^2/(V \cdot s)$. After being doped by 0.1 molar ratio praseodymium or ytterbium, it still maintains mobility value at 9.5 $cm^2/(V \cdot s)$. Or indium zinc oxide with a molar ratio of $In_2O_3$:ZnO is 2.5:1, it exhibits high mobility that its mobility value is over 50 $cm^2/(V \cdot s)$. Even being doped by 0.2 molar ratio praseodymium or ytterbium, its mobility value is also higher than 33 $cm^2/(V \cdot s)$. It does not only maintain high current switching ratio but also exhibits good stability and weak photo-current characteristics.

Preferably, the metal oxide is indium gallium zinc oxide. A molar ratio of indium and gallium and zinc complies with the following formulas: In/(In+Zn)≥0.76, 0≤Ga/In≤0.8. For example, indium gallium zinc oxide with a molar ratio of In:Ga:Zn is 3.170:1.585:1 could be doped by praseodymium or ytterbium at high molar ratio. Being doped by 0.1 molar ratio praseodymium or ytterbium, its mobility value is still higher than 10 $cm^2/(V \cdot s)$. The indium gallium zinc oxide with a molar ratio of In:Ga:Zn is 3.170:2.536:1 could also be chosen.

Preferably, the doping molar ratio of praseodymium or ytterbium in rare-earth oxide to metal oxide could be in a range from 0.02:1 to 0.40:1. The semiconductor with praseodymium or ytterbium doped at the said doping molar ratio exhibits excellent suppression to photo-current effect and preferable mobility at the same time. More preferably, the doping molar ratio of praseodymium or ytterbium in rare-earth oxide to metal oxide could be in a range from 0.10:1 to 0.20:1. The metal oxide semiconductor with praseodymium or ytterbium doped at the said doping molar ratio exhibits high mobility and good stability with its current switching ratio around $10^8$.

To achieve the second objects, the present application provides the technical solutions as follows:

A thin-film transistor comprising an active layer. The active layer is made of the composite metal oxide semiconductor by a physical vapor deposition process, a chemical vapor deposition process, an atomic layer deposition process, a laser deposition process, or a solution process. A variation of the turn-on voltage ($\Delta V_{on}$) is less than 2 V between illumination condition (10000 nits) and dark condition. Or preferably, $\Delta V_{on}$ is less than 1 V.

Preferably, the active layer is deposited by magnetron sputtering. A sputtering pressure is in a range from 0.1 to 0.6 Pa, an oxygen volume ratio in sputtering gas is in a range from 10 to 50 percent, a substrate temperature is in a range from room temperature to 300° C. In specifics, the active layer is made by singer target sputtering or co-sputtering. An active layer with good uniformity, well adhesion, and well quality could be deposited under the sputtering condition.

More preferably, the active layer is made by singer target magnetron sputtering.

Preferably, the thin-film transistor further comprises a substrate, a gate electrode, a gate insulator layer, a source and drain electrode, and a passivation layer. The thin-film transistor is an etch-stop structure, a back-channel etch structure, or a top-gate self-alignment structure.

The passivation layer is a made of $SiO_2$ film or layered structure consisted of $Si_3N_4$ and $SiO_2$.

The substrate is rigid substrate such as alkaline glass, alkaline-free glass, quartz glass or silicon substrate, or some flexible substrates such as polyimide (PI), polyethylene naphthalene (PEN), polyethylene terephthalate (PET), polyethylene (PE), polypropylene (PP), polystyrene (PS), polyethersulfone (PES) or foil and so on.

The gate electrode could be transparent conductive oxides some transparent conductive oxides such as ITO, AZO, GZO, IZO, ITZO, FTO and so on, or some metal such as Mo, Al, Cu, Ag, Ti, Au, Ta, Cr, Ni and so on or their alloy, or some metal and oxides layered material such as ITO/Ag/ITO, IZO/Ag/IZO and so on, or some layered metal such as Mo/Al/Mo, Ti/Al/Ti and so on.

The gate electrode could be grown by sputtering, electroplating, thermal evaporation and so on. The optimize method is sputtering, since the films exhibits excellent adhesion to the substrate, good uniformity and could be to realize large area.

The gate insulator layer on the gate electrode could be one of $SiO_2$, $Si_3N_4$, $Al_2O_3$, $Ta_2O_5$, $HfO_2$, and $Y_2O_3$, and polymer organic film layer and so on, or layered structure consisting of those materials. The gate insulator layer could be a multi-layered structure, which not only exhibits excellent insulating performance but also improves interface characteristics between the active layer and gate insulator layer. In addition, the fabricating process of the gate insulator layer could be carried out by physical vapor deposition, chemical vapor deposition, atomic layer deposition, laser deposition, anodization or solution process and so on.

It should be particularly noted that in the fabricating process of the back-channel etch structural devices, a suitable etching selectivity ratio of the source and drain electrodes and the active layer should be carefully considered or otherwise the device fabrication cannot be successfully achieved. Hydrogen peroxide-based etching solution is a preferable etching solution for the reason that the composite metal oxide semiconductor material of the present application can effectively resist the wetness etching by it, which shows high etching selectivity ratio with the metal such as molybdenum, molybdenum alloy, molybdenum/copper, titanium/copper, etc. The metal oxide semiconductor material is unaffected by the etching solution, and the transistor made thereof exhibits excellent performance and good stability.

To achieve the third objects, the present application provides the technical solutions as follows:

Application of the thin-film transistor in the display panel or detector.

The theories of this application are as following:

Comparing to the traditional way that suppressing the oxygen vacancies by large amount of gallium, the composite metal oxide semiconductor material in this application calls for only a small amount of rare-earth to suppress the oxygen vacancies effectively by doping praseodymium and/or ytterbium to indium oxide-based metal oxide, since the praseodymium or ytterbium exhibit high bond dissociation energy of 753.0($\Delta H_f 298$, kJ/mol) and 715.0($\Delta H_f 298$, kJ/mol) respectively. Therefore, the doping molar ratio could be cut down substantially to suppress the same oxygen vacancies, which will improve the overlap of 5 s orbit of $In^{3+}$ ion and ensured the high mobility. Traditional IGZO material only shows mobility of 10 $cm^2/(V \cdot s)$ while transistor made of the praseodymium and/or ytterbium doped indium oxide-based metal oxide semiconductor in this application could reach high mobility of 50 $cm^2/(V \cdot s)$.

Compared to the prior art, the beneficial effects of the present application are as follows:

This application discloses a praseodymium or ytterbium doped indium oxide-based metal oxide semiconductor. The oxygen vacancies could be suppressed at a relatively low doping molar ratio. The indium oxide-based metal oxide could be indium zinc oxide, indium gallium oxide or indium gallium zinc oxide. Comparing to traditional indium gallium zinc oxide, the mobility of the transistor made thereof is unaffected.

After being doped by praseodymium oxide or ytterbium oxide, the composite metal oxide semiconductor will introduce impurity level near the Fermi level, therefor producing recombination centers for photo-induced carriers at 0.3 eV deviation range over the Fermi level. Those recombination centers could provide a rapid recombination channel that could avoid the photo-induced carriers to affect the I-V characteristics or stability, which could substantially improve the light stability of the metal oxide semiconductor.

Where in: 01, substrate; 02, gate electrode; 03, gate insulator layer; 04, active layer; 05, etch-stop layer; 06-1, source electrode; 06-2, drain electrode; 07, passivation layer; 08, buffer layer.

DESCRIPTION OF EMBODIMENTS

Hereinafter, in conjunction with the accompanying drawings and specific embodiments, the present application will be further described. It should be noted that, in the case of non-collision, a new embodiment may be formed by any combination between the embodiments described below or between the technical features.

The following are specific embodiments of the present application, and the raw materials, equipment and the like used in the combined embodiments can be obtained by purchase unless otherwise specified.

Example 1: Ytterbium-Doped Indium Gallium Oxide Semiconductor

Example 1 discloses a group of metal oxide semiconductor materials. Those metal oxide semiconductor materials are ytterbium-doped indium gallium oxides which are obtained by doping ytterbium oxide to the indium gallium oxide as a light stabilizer.

Where in, the molar ratio of In and Ga is 5:4 in indium gallium oxide. In the ytterbium doped indium gallium oxides, the doping molar ratio of ytterbium to indium gallium oxide is 0.002, 0.020, 0.100, 0.200, 0.40 and 0.60, respectively.

Example 2: Ytterbium-Doped Indium Zinc Oxide Semiconductor

Example 2 discloses a group of metal oxide semiconductor materials. Those metal oxide semiconductor materials are ytterbium-doped indium zinc oxides which are obtained by doping ytterbium oxide to the indium zinc oxide as a light stabilizer.

Where, the molar ratio of In and Zn is 5:1 in indium zinc oxide. In the ytterbium-doped indium zinc oxides, the doping molar ratio of ytterbium to indium zinc oxide is 0.002, 0.020, 0.100, 0.200, 0.40 and 0.60, respectively.

Example 3: Praseodymium-Doped Indium Gallium Zinc Oxide Semiconductor

Example 3 discloses a group of metal oxide semiconductor materials. Those metal oxide semiconductor materials are praseodymium-doped indium gallium zinc oxides which are obtained by doping praseodymium oxide to the indium gallium zinc oxide as a light stabilizer.

Where in, the molar ratio of In, Ga and Zn is 3.170:1.585:1 in indium gallium zinc oxide. In the praseodymium doped indium gallium zinc oxides, the doping molar ratio of praseodymium to indium gallium zinc oxide is 0.002, 0.020, 0.100, 0.200, 0.40 and 0.60, respectively.

Example 4: Praseodymium-Doped Indium Gallium Zinc Oxide Semiconductor

Example 4 discloses a group of metal oxide semiconductor materials. Those metal oxide semiconductor materials are praseodymium-doped indium gallium zinc oxides which are obtained by doping praseodymium oxide to the indium gallium zinc oxide as a light stabilizer.

Where, the molar ratio of In, Ga and Zn is 3.170:2.536:1 in indium gallium zinc oxide. In the praseodymium-doped indium gallium zinc oxides, the doping molar ratio of praseodymium to indium gallium zinc oxide is 0.002, 0.020, 0.100, 0.200, 0.40 and 0.60, respectively.

Example 5: Ytterbium-Doped Indium Gallium Oxide Thin-Films

Example 5 discloses a group of metal oxide thin-films. Those ytterbium-doped indium gallium oxide thin-films are deposited by magnetron sputtering of ytterbium doped indium gallium oxide semiconductor materials in example 1.

Those metal oxide thin-films are made by co-sputtering of indium gallium oxide target (IGO, doping molar ratio y=0) and ytterbium-doped indium gallium oxide target (Yb:IGO, doping molar ratio y=0.60). The fabrication of thin-films with different doping molar ratio was obtained by changing the sputtering power.

Where in, the molar ratio of $In_2O_3:Ga_2O_3$ is 5:4 in indium gallium oxide target, which is marked as In(5)Ga(4). The molar ratio of ytterbium and indium gallium oxide in ytterbium-doped indium gallium oxide target is 0.60:1.00, which is marked as Yb: In(5)Ga(4). That is, a group of thin-films with gradient ytterbium doping molar ratios are obtained by changing the sputtering power. The ytterbium doping molar ratio value y to the indium gallium oxide in this example is 0.002, 0.020, 0.100, 0.200, 0.40 and 0.60, respectively.

All the thickness of those thin-films is 40 nm. All those thin-films are made by sputtering in Ar and $O_2$ mixture gas in a volume ratio of 8:2 at 0.5 Pa. Those thin-films are annealed at 350° C. in air for 30 min before patterning. The chemical compositions of the thin-films are analyzed by X-ray photoelectron spectroscopy and transmission electron microscopy; portions with trace concentration are conjectured base on sputtering power.

Example 6: Ytterbium-Doped Indium Zinc Oxide Thin-Films

Example 6 discloses a group of metal oxide thin-films. Those ytterbium doped indium zinc oxide thin-films are deposited by magnetron sputtering of ytterbium doped indium zinc oxide semiconductor materials in example 2.

Those metal oxide thin-films are made by co-sputtering of indium zinc oxide target (IZO, doping molar ratio y=0) and ytterbium-doped indium zinc oxide target (Yb:IZO, doping molar ratio y=0.60). The fabrications of thin-films with different doping molar ratios are obtained by changing the sputtering power.

Where in, the molar ratio of $In_2O_3:ZnO$ is 2.5:1 in indium zinc oxide target, which is marked as In(5)Zn(1). The doping molar ratio of ytterbium and indium zinc oxide in ytterbium doped indium zinc oxide target is 0.60:1.00, which is marked as Yb: In(5)Zn(1). That is, a group of thin-films with gradient ytterbium doping molar ratio are obtained by changing the sputtering power. The ytterbium doping molar ratio value y to the indium zinc oxide in this example is 0.002, 0.020, 0.100, 0.200, 0.40 and 0.60, respectively.

All the thickness of those thin-films is 20 nm. All those thin-films are made by sputtering in Ar and $O_2$ mixture gas in a volume ratio of 8:2 at 0.5 Pa. Those thin-films are annealed at 350° C. in air for 30 min before patterning. The chemical compositions of the thin-films are analyzed by X-ray photoelectron spectroscopy and transmission electron microscopy; portions with trace concentration are conjectured base on sputtering power.

Example 7: Praseodymium-Doped Indium Gallium Zinc Oxide Thin-Films

Example 7 discloses a group of metal oxide thin-films. Those praseodymium-doped indium gallium zinc oxide thin-films are deposited by magnetron sputtering of praseodymium doped indium gallium zinc oxide semiconductor materials in example 3.

Those metal oxide thin-films are made by co-sputtering of indium gallium zinc oxide target (IGZO, doping molar ratio y=0) and praseodymium-doped indium gallium zinc oxide target (Pr:IGZO, doping molar ratio y=0.60). The fabrications of thin-films with different doping molar ratios are obtained by changing the sputtering power.

Where in, the molar ratio of In, Ga, Zn is 3.170:1.585:1 in indium gallium zinc oxide target, which is marked as In(3.170)Ga(1.585)Zn(1). The molar ratio of praseodymium and indium gallium oxide in praseodymium-doped indium gallium zinc oxide target is 0.60:1.00, which is marked as Pr:In(3.170)Ga(1.585)Zn(1). That is, a group of thin-films with gradient praseodymium doping molar ratios are obtained by changing the sputtering power. The praseodymium doping molar ratio value y to the indium gallium zinc oxide in this example is 0.002, 0.020, 0.100, 0.200, 0.40 and 0.60, respectively.

All the thickness of those thin-films is 30 nm. All those thin-films are made by sputtering in Ar and $O_2$ mixture gas in a volume ratio of 8:2 at 0.5 Pa. The substrate temperature is 200° C. Those thin-films are annealed at 350° C. in air for 30 min before patterning. The chemical compositions of the thin-films are analyzed by X-ray photoelectron spectroscopy and transmission electron microscopy; portions with trace concentration are conjectured base on sputtering power.

Example 8: Praseodymium Doped Indium Gallium Zinc Oxide Thin-Films

Example 8 discloses a group of metal oxide thin-films. Those praseodymium doped indium gallium zinc oxide thin-films are made by a solution process of praseodymium doped indium gallium zinc oxide semiconductor materials in example 4.

This group of praseodymium doped indium gallium zinc oxide thin-film are made as to the following steps:

First step: weighing indium nitrate, zinc nitrate, and gallium nitrate according to the molar ratio of In, Ga, Zn in 3.170:2.536:1 to obtain an indium gallium zinc oxide matrix solution, which is marked as In(3.170)Ga(2.536)Zn(1). According to the specific doping molar ratio, a certain amount of praseodymium nitrate is added to obtain a group of praseodymium-doped indium gallium zinc mixed solution with different doping molar ratio; In this example, the doping molar ratio value y of praseodymium and In(3.170)Ga(2.536)Zn(1) is 0.002, 0.020, 0.100, 0.200, 0.40, and 0.60, respectively.

Second step: Ethanolamine, acetic acid, and ethylene glycol monomethyl ether solvent are added to each mixed solution respectively. Stirred at room temperature for 12 h and then standing for 12 h. The precursor solution was filtered, a light yellow transparent solution with a total concentration of indium, gallium, zinc, and praseodymium is 0.08 mol/L, the concentration of ethanolamine is 1.2 mol/L, and the concentration of acetic acid is 1.4 mol/L is obtained.

Third step: The substrate that needs to be prepared an active layer is first treated with UV for 30 min to increase the surface adhesion. Then the substrate sheet is placed on a spin coater, and 60 μL of the precursor solution obtained in the first step is added to the substrate sheet by a pipetting gun, stand still for 20 s. Start the spin coater at a500 rpm initial rotation speed for 3 s then a 3000 rpm later rotation speed for 40 s, so that the precursor solution is evenly coated on the substrate sheet; The substrate sheet was annealed at 120° C. for 10 min and then annealed at 450° C. for 120 min to obtain a praseodymium-doped indium gallium zinc oxide film (named as Pr:IGZO) with a film thickness of 40 nm.

Example 9: Thin-Film Transistors

Figure 1:
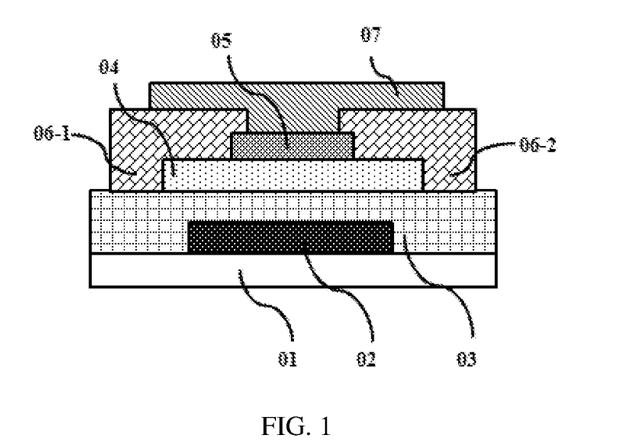
FIG. 1 is a schematic structural diagram of the thin-film transistor of example 9 and example 10.

A group of thin-film transistors employing an etch-stop structure, whose schematic structural diagrams are shown in FIG. 1, comprising: a substrate 01, a gate electrode 02 positioned on the substrate 01, a gate insulator layer 03 provided on the gate electrode 02 and the substrate 01, an active layer 04, an etch-stop layer 05, a source and drain electrode 06-1/06-2 that separately electrical connects to two sides of the active layer 04 and a passivation layer 07.

The active layer is made of thin-films in example 5.

The substrate 01 is made of glass and covered with silicon oxides buffer layer. The gate electrode 02 is a Mo/Al/Mo layered structure with a thickness of 50/200/50 nm to each layer, which is deposited by magnetron sputtering of corresponding material subsequently;

The gate insulator layer 03 is a $Si_3N_4/SiO_2$ layered structure with a thickness of 250/50 nm to each layer, which is fabricated by chemical vapor deposition (CVD). The $Si_3N_4$ layer electrical closes to the gate electrode 02 and the $SiO_2$ layer electrical faces to the active layer 04.

Both the etch-stop layer 05 and the passivation layer 07 are 300 nm $SiO_2$ layers that fabricated by CVD at 300° C.

Both the source electrode 06-1 and the drain electrode 06-2 in the source and drain electrode are Mo/Al/Mo layered structure with a thickness of 50/200/50 nm to each layer subsequently.

Example 10: Thin-Film Transistors

A group of thin-film transistors employing an etch-stop structure, whose schematic structural diagram are shown in FIG. 1, comprising: a substrate 01, a gate electrode 02 positioned on the substrate 01, a gate insulator layer 03 provided on the gate electrode 02 and the substrate 01, an active layer 04, an etch-stop layer 05, a source and drain electrode 06-1/06-2 that separately electrical connects to two sides of the active layer 04 and a passivation layer 07.

The active layer 04 is made of thin-films in example 6.

The substrate 01 is made of glass and covered with silicon oxides buffer layer. The gate electrode 02 is a Mo/Al/Mo layered structure with a thickness of 50/200/50 nm to each layer, which is deposited by magnetron sputtering of corresponding material subsequently.

The gate insulator layer 03 is a $Si_3N_4/SiO_2$ layered structure with a thickness of 250/50 nm to each layer, which is fabricated by chemical vapor deposition (CVD). The $Si_3N_4$ layer electrical closes to the gate electrode 02 and the $SiO_2$ layer electrical faces to the active layer 04.

Both the etch-stop layer 05 and the passivation layer 07 are 300 nm $SiO_2$ layers fabricated by CVD at 230° C.

Both the source electrode 06-1 and the drain electrode 06-2 in the source and drain electrode are Mo/Al/Mo layered structure with a thickness of 50/200/50 nm to each layer subsequently.

Example 11: Thin-Film Transistors

Figure 2:
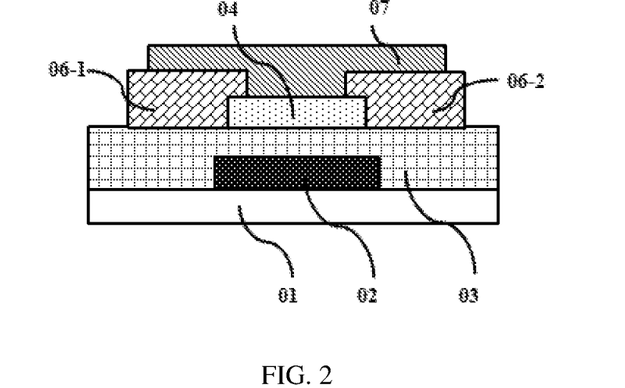
FIG. 2 is a schematic structural diagram of the thin-film transistor of example 11.

A group of thin-film transistors employing a back-channel etch structure, whose schematic structural diagram are shown in FIG. 2, comprising: a substrate 01, a gate electrode 02 positioned on the substrate 01, a gate insulator layer 03, an active layer 04 covers on an upper surface of the gate insulator layer 03 and corresponds to the gate electrode 02, a source and drain electrode 06-1/06-2 that separately electrical connects to two sides of the active layer 04, and a passivation layer 07.

The substrate 01 is made of rigid alkaline-free glass and covered with silicon oxides buffer layer.

The gate electrode 02 is a Cu/Mo layered structure with a thickness of 250/20 nm to each layer.

The gate insulator layer 03 is a $Si_3N_4/SiO_2$ layered structure with a thickness of 250/50 nm to each layer. The $Si_3N_4$ layer electrical closes to the gate electrode 02 and the $SiO_2$ layer electrical faces to the active layer 04.

The active layer 04 is made of thin-films in example 7.

Both the source electrode 06-1 and the drain electrode 06-2 in the source and drain electrode are Cu/Mo layered structure with a thickness of 250/20 nm to each layer subsequently. They are patterned under commercial of hydrogen peroxide-based etching solution which shows negligible damage to the active layer and leaves no etching residue.

The passivation layer 07 is 300 nm $SiO_2$ layer fabricated by CVD at 250° C.

Example 12: Thin-Film Transistors

Figure 3:
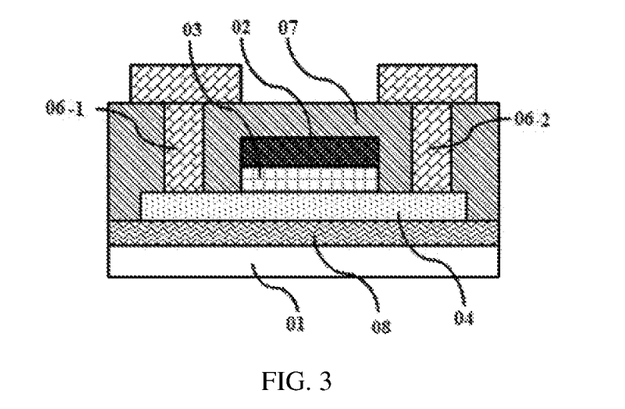
FIG. 3 is a schematic structural diagram of the thin-film transistor of example 12.

A group of thin-film transistors employing a top-gate self-alignment structure, whose schematic structural diagram are shown in FIG. 3, comprising: a substrate 01, a buffer layer 08, an active layer 04, a gate insulator layer 03 and a gate electrode 02 positioned on the active layer 03, a passivation layer 07 covers on the active layer 04 and an upper surface of the gate electrode 02, a source and drain electrode 06-1/06-2 insert through the passivation layer 07 and connect to two sides of the active layer 04.

The substrate 01 is made of rigid glass.

The buffer layer 08 is made by plasma-enhanced chemical vapor deposition of $SiO_2$.

The active layer 04 is made of thin-films in example 8.

The gate insulator layer 03 is made of $SiO_2$ with a thickness of 300 nm. The gate electrode 02 is a Cu/Mo layered structure with a thickness of 200/20 nm to each layer which is deposited by magnetron sputtering.

The passivation layer 07 is a $SiO_2/Si_3N_4$ layered structure with a thickness of 200/100 nm to each layer.

Both the source electrode 06-1 and the drain electrode 06-2 in the source and drain electrode are Cu/Mo layered structure with a thickness of 200/20 nm to each layer subsequently.

In examples 9 to 12, the detailed descriptions of material or fabrication of each function layer are as follows:

There is no special restriction of the substrate in this present application, which means almost all the substrates well-known in this specialized field will do. For example, some rigid substrate such as alkaline glass, alkaline-free glass, quartz glass or silicon substrate, or some flexible substrates such as polyimide (PI), polyethylene naphthalene (PEN), polyethylene terephthalate (PET), polyethylene (PE), polypropylene (PP), polystyrene (PS), polyethersulfone (PES) or foil and so on.

There is no special restriction of gate electrode material in this present application, which means almost all the gate electrode material well-known in this specialized field will do. For example, some transparent conductive oxides such as ITO, AZO, GZO, IZO, ITZO, FTO and so on, or grapheme, or some metal such as Mo, Al, Cu, Ag, Ti, Au, Ta, Cr, Ni and so on or their alloy, or some metal and oxides layered material such as ITO/Ag/ITO, IZO/Ag/IZO and so on, or some composite conductive film fabricated from layered metal such as Mo/Al/Mo, Ti/Al/Ti and so on.

The fabrication of the gate electrode could be carried out by deposition methods such as sputtering, electroplating, thermal evaporation and so on. The optimize method is sputtering since the film fabricated thereby exhibits excellent adhesion to the substrate, good uniformity and could be to realize large area.

Here, the employed structure of the gate electrode should be considered carefully depends on the desired technical parameters. For example, the transparent electrode is required at transparent display, which means the single-layer ITO or the ITO/Ag/ITO will do. In addition, high temperature resisted metal alloy should be applied when high-temperature processes are unavoidable at some special application.

There is no special restriction of the gate insulator layer material, which means almost all the well-known materials in this specialized field will do. Such as $SiO_2$, $Si_3N_4$, $Al_2O_3$, $Ta_2O_5$, $HfO_2$, and $Y_2O_3$, and polymer organic film layer and so on.

It should be noted that the composition of the gate insulating layer material may be inconsistent with the theoretical stoichiometric ratio. The gate insulator layer could be a multi-layered structure, which dose not only exhibits excellent insulating performance but also improves interface characteristics between the active layer and gate insulator layer. In addition, the fabricating process of the gate insulator layer could be carried out by physical vapor deposition, chemical vapor deposition, atomic layer deposition, laser deposition, anodization or solution process and so on.

The thickness of the active layer in examples 9-12 could be in a range of 5 nm to 100 nm. The carrier concentration of the metal oxide semiconductor film that makes the active layer should be small than $5\times10^{19}$ $cm^{-3}$.

The patterning process of the active layer is carried out by lithography that combining with wet or dry etching. The etching solution in the wet etching process including phosphoric acid, a mixture of nitric acid and glacial acetic acid, commercial oxalate-based etching solution, dilute hydrochloric acid etching solution, or hydrofluoric acid.

The patterning process of the source electrode and the drain electrode is carried out by lithography that combining with wet or dry etching. The etching solution in the wet etching process including phosphoric acid, a mixture of nitric acid and glacial acetic acid or a mixture based on hydrogen peroxide. For dry etching, a plasma etching process may be selected, and the etching gas includes a chlorine-based or fluorine-based gas.

In the vacuum magnetron sputtering process that fabricating the active layer by metal oxide semiconductor material, single target sputtering or co-sputtering will do, preferably single target sputtering.

The active layer which is fabricated by single-target sputtering is more reproducible, more stable and its microstructure is easier to control; while the active layer which is fabricated by co-sputtering, the sputtered particles will be more affected by interference during the recombination process.

During vacuum sputtering deposition, the power source may be selected from radio frequency (RF) sputtering, direct current (DC) sputtering or alternating current (AC) sputtering, preferably alternating current sputtering in the industry.

During sputtering deposition, the sputtering pressure is optionally in a range of 0.1 Pa to 10 Pa, preferably in a range of 0.2 Pa to 0.7 Pa, more preferably 0.5 Pa, for it hard to maintain glow sputtering at a lower pressure, while the scattering of the sputtered particles during the deposition to the substrate will significantly increase, the energy loss increase, the kinetic energy reduce after reaching the substrate, and the defects of the thin-films made thereof will increase, which cause the performances of devices to be seriously affected at an excessive sputtering pressure.

During the sputtering deposition process, the oxygen partial pressure is in a range of 0 to 1 Pa, preferably in a range of 0.001 to 0.5 Pa, preferably in a range of 0.01 to 0.1 Pa. The oxygen volume ratio is in a range of 0.1 to 0.3, preferably in a range of 0.2 to 0.3.

In general, during the sputtering process that fabricating the active layer by the oxide semiconductor, the oxygen partial pressure shows a direct effect on the carrier concentration of the film, and oxygen vacancy-related defects may be introduced. Too low oxygen partial pressure may cause a serious mismatch of oxygen in the film and increase carrier concentration, while excessive oxygen vacancies will cause weak bonds and degrade the reliability of the devices.

The substrate temperature during sputtering deposition is preferably in a range from room temperature to 300° C., preferably in a range from 200 to 300° C.

During the deposition of the active layer, a certain substrate temperature can effectively improve the bonding mode of the sputtered particles after reaching the substrate, thus reducing the existence of weak bonds and improve the stability of the device. Of course, this effect can also be achieved by subsequent annealing processes and the like.

The thickness of the active layer is in a range from 2 to 100 nm, preferably in a range from 5 to 50 nm, and more preferably in a range from 20 to 40 nm.

There is no special restriction of the source electrode and drain electrode materials in this present application, which means that it can be selected arbitrarily from materials well-known in this specialized field affecting the realization of various desired structural devices. For example, some transparent conductive oxides such as ITO, AZO, GZO, IZO, ITZO, FTO and so on, or grapheme, or some metal such as Mo, Al, Cu, Ag, Ti, Au, Ta, Cr, Ni and so on or their alloy, or some metal and oxides layered material such as ITO/Ag/ITO, IZO/Ag/IZO and so on, or some composite conductive film fabricated from layered metal such as Mo/Al/Mo, Ti/Al/Ti and so on.

The fabricating process of the source electrode and drain electrode may be a sputtering method, thermal evaporation, or other deposition method. The sputtering deposition is the preferred method because the electrode fabricated thereby exhibits good adhesion to the substrate, good uniformity, and could be to realize large areas.

It should be particularly noted that in the fabricating process of the back-channel etch structural thin-film transistor, a suitable etching selectivity ratio of the source electrode and drain electrode and the active layer should be carefully considered or otherwise the device fabrication cannot be successfully achieved.

The etching solution in the wet etching process in the example of the present application is based on a conventional etching solution for metal in the industry, for example, a hydrogen peroxide based etching solution, for the reason that the metal oxide semiconductor material of the present application can effectively resist the wetness, which shows high etching selectivity ratio with the metal such as which shows high etching selectivity ratio with the metal such as molybdenum, molybdenum alloy, molybdenum/copper, titanium/copper, etc. The metal oxide semiconductor material is unaffected by the etching solution, and the transistor made thereof exhibits excellent performance and good stability.

Besides, the dry etching in the example of the present application is based on an industrial conventional etching gas, such as a chlorine-based gas or a fluorine-based gas, etc., which shows limited damage to the oxide semiconductor active layer of the present application, and the device fabricated thereof shows excellent performance and high stability.

There is no special restriction of the passivation layer materials in this present application, which means it can be arbitrarily selected from materials well known in the art such as silicon oxide, silicon nitride, aluminum oxide, hafnium oxide, tantalum oxide, hafnium oxide, and a polymer organic film layer and so on.

The composition of the passivation layer may be inconsistent with the theoretical stoichiometric ratio.

Besides, the insulator layer could be a multi-layered insulator layer, which not only exhibits excellent insulating performance but also improves interface characteristics between the active layer and the passivation layer. Also, the fabricating process of the passivation layer could be carried out by physical vapor deposition, chemical vapor deposition, atomic layer deposition, laser deposition, anodization or solution process and so on.

Here is a further description of the treatment process during the fabrication of the thin-film transistors in the examples of the present application.

Relatively speaking, the deposition rate of the thin-film which is fabricated by sputtering is faster because of the participation of high energy plasma. The thin-film does not have sufficient time to perform a relaxation process during deposition, which causes a certain proportion of dislocation and stress remained in the film. That requires a post-heat annealing treatment to further achieve the desired relative steady state and improve the properties of the film.

In the example of the present application, the annealing process is commonly employed after deposition of the active layer or after deposition of the passivation layer. For one thing, the annealing treatment after deposition of the active layer can effectively improve the in-situ defects and improve the ability to resist damage in subsequent processes. For another thing, during subsequent deposition of the passivation layer an "activation" process may be required due to the participation of the plasma and the modification of the reactive groups, to further eliminate the effects of interface states and some donor doping.

Besides, in the implementation of the present application, the method of interface treatment is not restricted to heat treatment, but also suitable to plasma processing interface, such as the interface between a gate insulating layer and semiconductor, or the interface between the active layer and passivation layer interface, etc. Through the interface treatment mentioned above, the performances of the device can be effectively improved, and the stability of the devices can be improved.

The thin-film transistors in examples 9 and 10 can be an enclosed structure consisting of the substrate, the gate electrode, the gate insulator layer, the active layer, the etch-stop layer, the source electrode, the drain electrode, and a passivation layer, or further comprising of a planarization layer, a reflective electrode, a pixel definition layer and so on, or even integrating with other devices.

The thin-film transistors in example 11 can be an enclosed structure consisting of the substrate, the gate electrode, the gate insulator layer, the active layer, the source electrode, the drain electrode and a passivation layer, or further comprising of a planarization layer, a reflective electrode, a pixel definite layer and so on, or even integrating with other devices.

The thin-film transistors in example 12 can be an enclosed structure consisting of the substrate, the active layer, the gate electrode, the gate insulator layer, the passivation layer, the source electrode, the drain electrode, or further comprising of a passivation layer, a pixel definition layer and so on, or even integrating with other devices.

The thin film transistor obtained in examples 9 to 12 can be applied to a display panel for driving a display unit in a display panel, or the thin film transistor is used to drive the detector.

Performance Testing and Characterizing

The Characterization of the Photo-Current Effect

The photo-current effects are characterized by irradiating the active layer of the thin-film transistors in examples 9 to 12 using commercially available LED lights with the intensitie of 5000 nits. Variations of the turn-on voltage ($\Delta V_{on}$) are calculated to evaluate the strength of the photo-current effects of the transistors. Wherein, the turn-on voltage is defined as the voltage of the gate electrode corresponding to the current between the source and drain electrodes at $10^{-9}$ A. The light-response characteristics are shown by the transistor's turn-on voltage variation amplitude ($\Delta V_{on}$) under illumination and without. The larger the value, the stronger the photo-current effects, and vice versa.

The Characterization of Negative-Bias Light Stability

The negative-bias light stability is characterized by irradiating the active layer of the thin-film transistors in examples 9 to 12 using commercially available LED lights with the intensitie of 5000 nits with a voltage of −30 V was applied to the gate electrode of the transistor, and a 0 V bias was applied across the source and drain electrodes. The negative-bias light stability of the transistor under light irradiation can be obtained by testing the transfer characteristic curve of the device after a period of time interval. A large variation in thin-film transistors characteristics indicates poor stability, and vice versa.

PL Spectrum and Characterization of Lifespan

In principle, the active layer absorbs the energy under light irradiation to producing a photo-excitation process. Photo-excitation causes the electron to transition to higher excited state then releases the energy after the relaxation process to return to a lower energy level. The light radiation or luminescence in this process is called photoluminescence, which is called as PL. The un-doped and doped thin-film of the examples 5-8 are characterized using a commercial PL test system to understand the transport of photo-induced carriers in the thin-film after illumination. Besides, their recombination mechanism was further evaluated by testing their lifespan.

Figure 4:
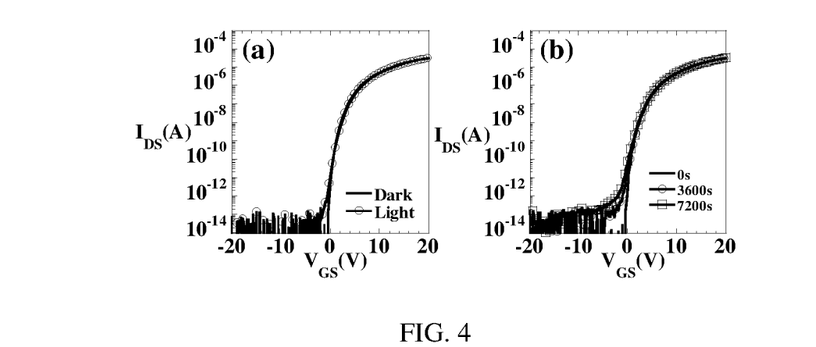
FIG. 4 is the light-response curves of the thin-film transistors of example 9.

The specific parameters and performance of the thin film transistors group 1-7 of example 9 are shown in the following table, and the photo-current effects and negative-bias light stability of the device when the doping molar ratio is 0.100 are as shown in FIG. 4(*a*) and FIG. 4(*b*), respectively.

TABLE 1

| | test | 1 | 2 | 3 | 4 | 5 | 6 | 7 |
|---|---|---|---|---|---|---|---|---|
| InGaO | the molar ratio of In/Ga | | | | 5:4 | | | |
| ytterbium | the value of y | 0 | 0.002 | 0.020 | 0.10 | 0.20 | 0.40 | 0.60 |
| active layer | deposition method | | | | sputtering | | | |
| deposition | $O_2/(Ar + O_2)(\%)$ | | | | 20 | | | |
| | sputtering pressure(Pa) | | | | 0.5 | | | |
| | substrate temperature (° C.) | | | | room temperature | | | |
| active layer treatment | annealing | | | | air-350° C. | | | |
| Composition | substrate | | | | glass | | | |
| | buffer layer | | | | $SiO_2$ | | | |
| | gate electrode | | | | Mo/Al/Mo | | | |
| | gate insulator layer | | | | $SiO_2/Si_3N_4$ | | | |
| | etch-stop layer | | | | $SiO_2$ | | | |
| | source and drain electrode | | | | Mo/Al/Mo | | | |
| | passivation layer | | | | $SiO_2$ | | | |
| After passivation layer | annealing | | | | air-350° C. | | | |
| Performance | threshold voltage $V_{th}(V)$ | −0.2 | 0.2 | 0.5 | 1.5 | 3.5 | 4.6 | 5.4 |
| | mobility $\mu(cm^2/(V \cdot s))$ | 14.8 | 14.2 | 12.4 | 9.5 | 5.2 | 1.9 | 0.03 |
| | sub-threshold swing SS(V/decade) | 0.14 | 0.15 | 0.21 | 0.26 | 0.35 | 0.38 | 0.47 |
| | current switching ratio $I_{on}/I_{off}$ | $10^9$ | $10^9$ | $10^9$ | $10^9$ | $10^8$ | $10^7$ | $10^6$ |
| | stability [a] | −− | − | + | ++ | ++ | ++ | ++ |
| | photo-current effect −−$\Delta$Von(V) | 7.30 | 2.50 | 1.20 | 0.15 | 0.05 | 0.01 | 0.01 |

Figure 5:
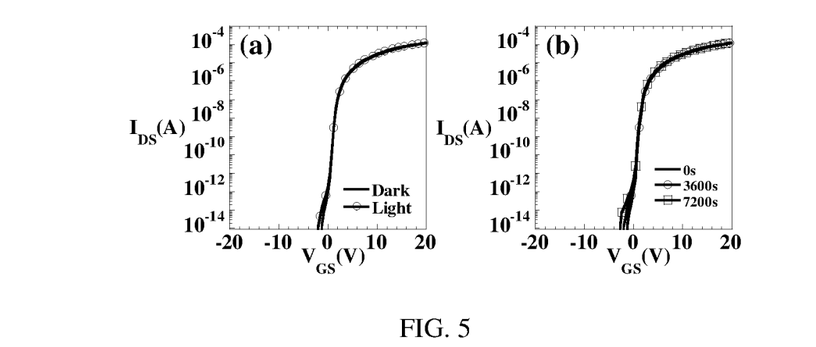
FIG. 5 is the light-response curves of the thin-film transistors of example 10.

Note:
[a] −− poor;
−, relatively poor;
+, good;
++, excellent;

The specific parameters and performance of the thin film transistors group 1-7 of example 10 are shown in the following table, and the photo-current effects and negative-bias light stability of the device when the doping molar ratio is 0.100 are as shown in FIG. 5(a) and FIG. 5(b), respectively.

TABLE 2

| | test | 1 | 2 | 3 | 4 | 5 | 6 | 7 |
|---|---|---|---|---|---|---|---|---|
| InZnO | the molar ratio of In/Zn | | | 5:1 | | | | |
| Ytterbium | the value of y | 0 | 0.002 | 0.020 | 0.10 | 0.20 | 0.40 | 0.60 |
| Active layer deposition | deposition method | | | sputtering | | | | |
| | $O_2/(Ar + O_2)(\%)$ | | | 20 | | | | |
| | Sputtering pressure(Pa) | | | 0.5 | | | | |
| | substrate temperature (° C.) | | | room temperature | | | | |
| Active layer treatment | annealing | | | air-350° C. | | | | |
| Composition | substrate | | | glass | | | | |
| | buffer layer | | | $SiO_2$ | | | | |
| | gate electrode | | | Mo/Al/Mo | | | | |
| | gate insulator layer | | | $SiO_2/Si_3N_4$ | | | | |
| | etch-stop layer | | | $SiO_2$ | | | | |
| | source and drain electrode | | | Mo/Al/Mo | | | | |
| | passivation layer | | | $SiO_2$ | | | | |
| After passivation layer | annealing | | | air-350° C. | | | | |
| Performance | threshold voltage $V_{th}(V)$ | −1.2 | −1.1 | −0.5 | 0.1 | 1.3 | 3.6 | 5.2 |
| | mobility $\mu(cm^2/(V \cdot s)$ | 56.8 | 53.1 | 51.3 | 45.4 | 33.2 | 16.7 | 5.3 |
| | sub-threshold swing SS(V/decade) | 0.12 | 0.12 | 0.16 | 0.17 | 0.21 | 0.28 | 0.45 |
| | current switching ratio $I_{on}/I_{off}$ | $10^9$ | $10^9$ | $10^9$ | $10^9$ | $10^8$ | $10^7$ | $10^6$ |
| | stability [a] | -- | − | + | ++ | ++ | ++ | ++ |
| | photo-current effect —$\Delta$Von(V) | 12.60 | 5.40 | 1.40 | 0.16 | 0.02 | 0.01 | 0.01 |

Figure 6:
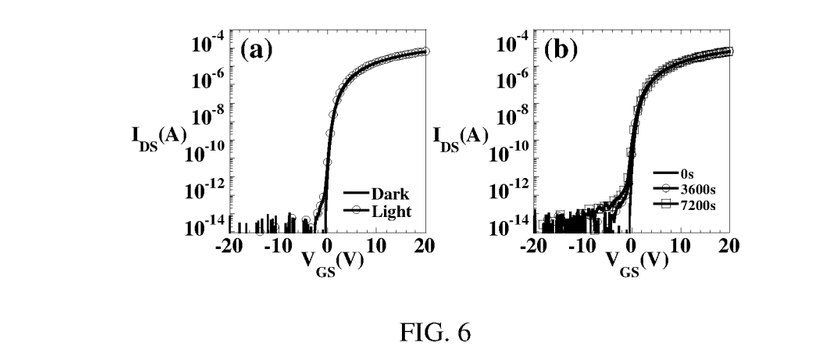
FIG. 6 is the light-response curves of the thin-film transistors of example 11.

Note:
[a] --poor;
−, relatively poor;
+, good;
++, excellent;

The specific parameters and performance of the thin film transistors group 1-7 of example 11 are shown in the following table, and the photo-current effects and negative-bias light stability of the device when the doping molar ratio is 0.100 are as shown in FIG. 6(a) and FIG. 6(b), respectively.

TABLE 3

| | test | 1 | 2 | 3 | 4 | 5 | 6 | 7 |
|---|---|---|---|---|---|---|---|---|
| InGaZnO | the molar ratio of In/Ga/Zn | | | 3.170:1.585:1 | | | | |
| praseodymium | the value of y | 0 | 0.002 | 0.020 | 0.10 | 0.20 | 0.40 | 0.60 |
| active layer deposition | deposition method | | | sputtering | | | | |
| | $O_2/(Ar + O_2)(\%)$ | | | 20 | | | | |
| | sputtering pressure(Pa) | | | 0.5 | | | | |
| | substrate temperature (° C.) | | | 200° C. | | | | |
| active layer treatment | annealing | | | Air-350° C. | | | | |
| Composition | substrate | | | glass | | | | |
| | gate electrode | | | Mo/Cu | | | | |
| | gate insulator layer | | | $SiO_2/Si_3N_4$ | | | | |
| | source and drain electrode | | | Mo/Cu | | | | |
| | passivation layer | | | $SiO_2$ | | | | |

TABLE 3-continued

| test | | 1 | 2 | 3 | 4 | 5 | 6 | 7 |
|---|---|---|---|---|---|---|---|---|
| After passivation layer | annealing | | | | air-350° C. | | | |
| Performance | threshold voltage $V_{th}(V)$ | −1.8 | −1.7 | −1.3 | −0.2 | 1.2 | 3.8 | 5.6 |
| | mobility $\mu(cm^2/(V \cdot s))$ | 22.9 | 21.8 | 16.3 | 13.6 | 8.3 | 4.4 | 1.4 |
| | sub-threshold swing SS(V/decade) | 0.12 | 0.12 | 0.14 | 0.17 | 0.24 | 0.27 | 0.49 |
| | current switching ratio $I_{on}/I_{off}$ | $10^9$ | $10^9$ | $10^9$ | $10^9$ | $10^9$ | $10^8$ | $10^7$ |
| | stability [a] | −− | − | + | ++ | ++ | ++ | ++ |
| | photo-current effect —$\Delta V_{on}(V)$ | 9.30 | 4.20 | 1.10 | 0.12 | 0.08 | 0.01 | 0.01 |

Figure 7:
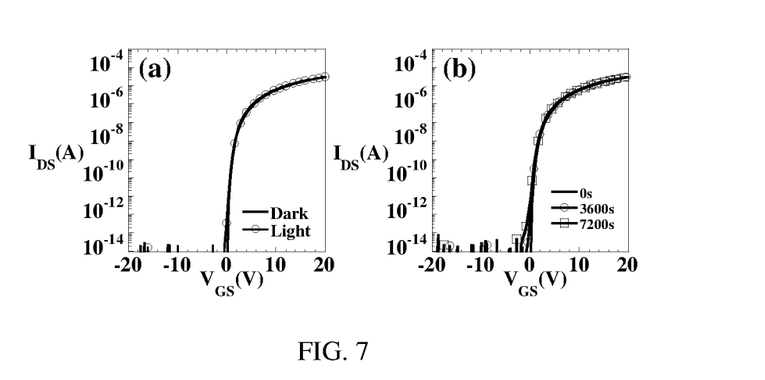
FIG. 7 is the light-response curves of the thin-film transistors of example 12.

Note:
[a] −−, poor;
−, relatively poor;
+, good;
++, excellent;

The specific parameters and performance of the thin film transistors group 1-7 of example 12 are shown in the following table, and the photo-current effects and negative-bias light stability of the device when the doping molar ratio is 0.100 are as shown in FIG. 7(a) and FIG. 7(b), respectively.

TABLE 4

| | test | 1 | 2 | 3 | 4 | 5 | 6 | 7 |
|---|---|---|---|---|---|---|---|---|
| InGaZnO | the molar ratio of In/Ga/Zn | | | | 3.170:2.536:1 | | | |
| praseodymium | the value of y | 0 | 0.002 | 0.020 | 0.10 | 0.20 | 0.40 | 0.60 |
| active layer deposition | deposition method | | | | Solution process | | | |
| | substrate temperature (° C.) | | | | 120° C. | | | |
| active layer treatment | annealing | | | | 450° C. | | | |
| Composition | substrate | | | | glass | | | |
| | buffer layer | | | | SiOx | | | |
| | gate insulator layer | | | | SiOx | | | |
| | gate electrode | | | | Mo/Cu | | | |
| | passivation layer | | | | $SiO_2/Si_3N_4$ | | | |
| | source and drain electrode | | | | Mo/Cu | | | |
| After passivation layer | Annealing | | | | air-350° C. | | | |
| Performance | threshold voltage $V_{th}(V)$ | −0.2 | −0.1 | 0.4 | 1.1 | 2.2 | 4.2 | 6.4 |
| | mobility $\mu(cm^2/(V \cdot s))$ | 12.5 | 11.3 | 8.4 | 6.5 | 4.1 | 1.7 | 0.02 |
| | sub-threshold swing SS(V/decade) | 0.22 | 0.22 | 0.26 | 0.28 | 0.32 | 0.36 | 0.49 |
| | current switching ratio $I_{on}/I_{off}$ | $10^8$ | $10^8$ | $10^8$ | $10^8$ | $10^8$ | $10^8$ | $10^7$ |
| | stability [a] | − | − | + | ++ | ++ | ++ | ++ |
| | photo-current effect —$\Delta V_{on}(V)$ | 6.30 | 2.20 | 0.50 | 0.13 | 0.02 | 0.01 | 0.01 |

Note:
[a] −−, poor;
−, relatively poor;
+, good;
++, excellent;

As shown in Table 1-4, doping of rare-earth oxide shows obvious influences on performances of the thin-film transistors. Firstly, the transistors without rare-earth doping exhibit the highest mobility, lower sub-threshold swing and negative threshold voltage but show strong photo-current effects, which means the performance of the thin-film transistors is degraded greatly under irradiation, such as negative threshold voltage shift and seriously degradation of sub-threshold swing. However, the photo-current effects of the transistors are obviously suppressed by doping a certain amount of praseodymium or ytterbium oxides. Certainly, with the doping molar ratio of praseodymium or ytterbium increasing, the characteristics such as mobility will further degenerate, the turn-on voltage variation amplitude $\Delta V_{on}$ will further be decreased, and the photo-current effects will further to be improved. An excess praseodymium or ytterbium doping molar ratio could result in an obvious degeneration in mobility, which will largely restrict the application of those transistors even though they exhibit very weak photo-current effects. Since that, a suitable doping molar ratio should be considered carefully to balance mobility against photo-current effects. It can be seen from Tables 1-4 that the doping molar ratio of praseodymium or ytterbium doped to the metal oxide semiconductor, that is, the y value, is positively correlated with the threshold voltage, sub-threshold swing, and stability, while negatively correlated with the mobility, current switching ratio, and photo-induced current.

As shown in FIG. 4 to FIG. 7, the transistors exhibit excellent light-response characteristic and negative-bias light stability after doping a certain amount of praseodymium or ytterbium, which greatly improved its potential in practical applications.

Figure 8:
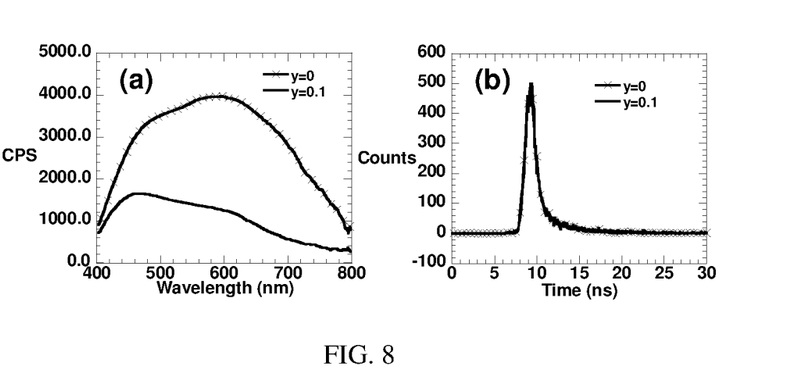
FIG. 8 is PL spectrum and lifespan characterization of indium gallium zinc oxide thin films with praseodymium doping at 0.1 molar or without praseodymium doping of example 7.

FIG. 8 is PL spectrum and lifespan characterization of indium gallium zinc oxide thin-film with praseodymium doping at 0.1 molar or without praseodymium doping of example 7. As can be seen from FIG. 8(a), the un-doped thin-film shows a weak intensity of the emission spectrum while the overall strengths further decrease after praseodymium doping. As can be seen from FIG. 8(b), the lifespan test shows that the carrier lifespans are several nanoseconds which are meanly changed. It can be inferred that the relaxation process of carriers in the thin-film is mainly a recombination process of non-radiative transition, that is, a photo-induced carrier rapid recombination center exists in the film.

Considering the comprehensive performance, it can be seen from Table 1 that the active layer made of ytterbium-doped indium gallium oxide, when the doping molar ratio y is in a range from 0.02 to 0.40, the overall performance of the transistor is better, and more preferably, when y is in a range from 0.02 to 0.20, the overall performance of the device is even better. When y is in a range from 0.10 to 0.20, the overall performance of the device is optimal.

As shown in Table 2, the active layer made of ytterbium-doped indium zinc oxide, when the doping molar ratio y is in a range from 0.02 to 0.40, the overall performance of the transistor is better, and more preferably, when y is in a range from 0.02 to 0.20, the overall performance of the device is even better. When y is in a range from 0.10 to 0.20, the overall performance of the device is optimal.

As shown in Table 3, the active layer made of praseodymium-doped indium gallium zinc oxide, when the doping molar ratio y is in a range from 0.02 to 0.40, the overall performance of the transistor is better, and more preferably, when y is in a range from 0.02 to 0.20, the overall performance of the device is even better. When y is in a range from 0.10 to 0.20, the overall performance of the device is optimal.

As shown in Table 4, in the active layer formed by the praseodymium oxide doped indium gallium zinc oxide semiconductor film, when y is in a range from 0.02 to 0.40, the overall performance of the transistor is better. When y is in a range from 0.02 to 0.20, the overall performance of the transistor is better. When y is in a range from 0.10 to 0.20, the overall performance of the transistor is optimal.

In overall, the doping molar ratio of the rare-earth oxide doped into the metal oxide semiconductor material is preferably from 0.02 to 0.40 in the present application, more preferably from 0.02 to 0.20, most preferably from 0.10 to 0.20. For indium zinc oxide or indium gallium zinc oxide with the most preferably doping molar ratio, the threshold voltage of the device is lower than 2V, the sub-threshold swing is lower than 0.40V/decade, the current switching ratio is about $10^8$ to $10^9$, the variation of the turn-on voltage is less than 0.2 V between illumination condition and dark condition, which means the photo-current characteristic is weak and the stability is excellent.

Those skilled in the art could make various other changes and the corresponding deformation according to the aspect and conception described above. All such changes and deformation should fall within the scope of the application as claimed in claims.

What is claimed is:

1. A composite metal oxide semiconductor, characterized in that the composite oxide semiconductor is a rare-earth oxide doped metal oxide; wherein the metal oxide is indium gallium oxide or indium gallium zinc oxide; the rare-earth oxide is praseodymium oxide; a doping molar ratio of praseodymium to the indium and gallium or indium and gallium and zinc of the metal oxide is in a range from 0.10:1 to 0.4:1; there are recombination centers for photo-induced carriers in the composite metal oxide semiconductor, wherein when the metal oxide is indium gallium zinc oxide, a molar ratio of indium and gallium and zinc complies with the formulas In/(In+Zn)≥0.76 and 0<Ga/In≤0.8, and when the metal oxide is indium gallium oxide, a molar ratio of indium and gallium is in a range from 5:1 to 5:4, wherein the doping molar ratio of praseodymium to the indium and gallium or indium and gallium and zinc of the metal oxide is in a range from greater than 0.25:1 to less than or equal to 0.4:1.

2. A thin-film transistor, comprising an active layer; the active layer is made of a composite metal oxide semiconductor by a physical vapor deposition process, a chemical vapor deposition process, an atomic layer deposition process, a laser deposition process, or a solution process; wherein
the composite oxide semiconductor is the composite metal oxide semiconductor of claim 1.

3. The thin-film transistor of claim 2, wherein the active layer is made by magnetron sputtering; a sputtering pressure is in a range from 0.1 to 0.6 Pa, an oxygen volume ratio in sputtering gas is in a range from 10 to 50 percent, a substrate temperature is in a range from room temperature to 300° C.

4. The thin-film transistor of claim 2, wherein further comprising a substrate, a gate electrode, a gate insulator layer, a source electrode, a drain electrode, and a passivation layer; the thin-film transistor is an etch-stop structure, a back-channel etch structure, or a top-gate self-alignment structure.

5. The thin-film transistor of claim 4, wherein the passivation layer is made of $SiO_2$ film or layered structure consisted of $Si_3N_4$ and $SiO_2$.

6. A method of applying a thin-film transistor in a display panel or detector; wherein
the thin-film transistor comprises an active layer which is made of a composite metal oxide semiconductor of claim 1 by a physical vapor deposition process, a chemical vapor deposition process, an atomic layer deposition process, a laser deposition process, or a solution process.

7. The composite metal oxide semiconductor of claim 1, wherein the metal oxide is indium gallium zinc oxide having the molar ratio of indium and gallium and zinc that complies with the formulas In/(In+Zn)≥0.76 and 0<Ga/In≤0.8.

* * * * *